(12) United States Patent
Hiroshima

(10) Patent No.: US 8,030,578 B2
(45) Date of Patent: Oct. 4, 2011

(54) ELECTRONIC COMPONENT AND SUBSTRATE UNIT

(75) Inventor: Yoshiyuki Hiroshima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 633 days.

(21) Appl. No.: 11/496,593

(22) Filed: Aug. 1, 2006

(65) Prior Publication Data

US 2007/0181642 A1     Aug. 9, 2007

(30) Foreign Application Priority Data

Feb. 9, 2006 (JP) ................................. 2006-032164

(51) Int. Cl.
*H05K 1/11* (2006.01)

(52) U.S. Cl. ........ 174/261; 174/260; 174/263; 361/760; 361/767; 361/768; 361/770; 361/786

(58) Field of Classification Search .................. 228/101; 219/603, 616, 617, 780, 69.15, 84, 119, 121.52; 174/255, 257, 259, 260, 261, 263, 266, 267; 257/4, 178, 181, 249, 276, 309, 448, 688; 361/760, 767, 768, 769, 770, 772, 774, 773, 361/786, 787, 803, 804
See application file for complete search history.

(56) References Cited

U.S. PATENT DOCUMENTS

| | | | | |
|---|---|---|---|---|
| 5,400,948 A | * | 3/1995 | Sajja et al. | 228/180.1 |
| 5,798,146 A | | 8/1998 | Murokh et al. | 427/458 |
| 6,409,069 B1 | * | 6/2002 | Harada et al. | 228/13 |
| 6,536,105 B1 | | 3/2003 | Sakai et al. | 29/843 |
| 6,552,277 B1 | * | 4/2003 | Downes | 174/267 |
| 6,555,052 B2 | | 4/2003 | Soga et al. | 420/560 |
| 6,562,505 B1 | | 5/2003 | Tsukuda et al. | 429/31 |
| 6,590,287 B2 | * | 7/2003 | Ohuchi | 257/738 |
| 6,623,283 B1 | * | 9/2003 | Torigian et al. | 439/83 |
| 6,774,490 B2 | | 8/2004 | Soga et al. | 257/772 |
| 6,940,023 B2 | | 9/2005 | Ishizuka et al. | 174/260 |
| 2002/0066583 A1 | | 6/2002 | Soga et al. | 174/50.56 |
| 2002/0124228 A1 | * | 9/2002 | Madni | 716/1 |
| 2003/0186072 A1 | | 10/2003 | Soga et al. | 428/620 |
| 2004/0262040 A1 | | 12/2004 | Ishizuka et al. | 174/262 |

FOREIGN PATENT DOCUMENTS

| | | |
|---|---|---|
| JP | 9-162220 | 6/1997 |
| JP | 10-154601 | 6/1998 |

(Continued)

OTHER PUBLICATIONS

Office Action dated Mar. 3, 2009 corresponding to Taiwan Patent Application No. 095127740.

(Continued)

*Primary Examiner* — Hoa C Nguyen

(74) *Attorney, Agent, or Firm* — Fujitsu Patent Center

(57) ABSTRACT

The present invention is an electrode 10 so provided as to be soldered to an electronic component 12 and, when the electronic component 12 is mounted on a substrate 13, soldered to the substrate 13. The electrode 10 includes a column-like electrode body 11 soldered to the electronic component 12 and to the substrate 13. The electrode has grooves as an air discharging device discharging the air 15*a* in air voids 15 generated within the solder 14 between joint surfaces 11*a*, 11*b* of the electrode body 11 and the electronic component 12 or the substrate 13 when the electrode body 11 is soldered to the electronic component 12 or the substrate 13.

6 Claims, 7 Drawing Sheets

FOREIGN PATENT DOCUMENTS

| | | |
|---|---|---|
| JP | 11-102820 | 4/1999 |
| JP | 11-345824 A | 12/1999 |
| JP | 11-345826 A | 12/1999 |
| JP | 2002-84055 | 3/2002 |
| JP | 3341715 | 8/2002 |
| JP | 2005-142497 A | 6/2005 |
| TW | 451359 | 8/2001 |
| TW | 556465 | 10/2003 |
| TW | I228439 | 1/2005 |

OTHER PUBLICATIONS

Japanese Notice of Reason for Rejection, English-language translation, mailed Dec. 7, 2010 for corresponding Japanese Application No. 2006-032164.

"JP Office Action", mailed by JPO and corresponding to Japanese application No. 2006-032164 on Mar. 1, 2011, with English translation.

* cited by examiner

ELECTRONIC COMPONENT AND SUBSTRATE UNIT

BACKGROUND OF THE INVENTION

1. Field of the Invention

The present invention relates generally to an electrode, an electronic component and a substrate, and more particularly, to a column-like electrode to which a large voltage is applied, an electronic component using this electrode, and a substrate.

2. Description of the Related Technology

For example, a large voltage is applied to a power source component and a power source module. The electronic component to which the large voltage is thus applied involves using, as shown in FIGS. 8A and 8B, a column-like butt electrode 50 or, as depicted in FIGS. 9A and 9B, a square-pole-like butt electrode 51.

Note that throughout the FIGS. 8A, 8B and FIGS. 9A, 9B, the numeral 52 designates an electronic component, 53 represents a substrate, 54 denotes a solder, and 55 indicates an air void.

In the conventional butt electrodes 50, 51, a column-like copper bar member taking a cylindrical shape, a square-pole-like shape, etc. is cut off to a predetermined length and used in an as-cut state. Namely, joint surfaces 50a, 50b, 51a, 51b and outer peripheral surfaces 50c, 51c, with the electronic component 52 and the substrate 53, of the butt electrodes 50, 51 are employed in a way that does not apply any other working to these surfaces.

[Patent Document 1] JP 09-162220 A

The conventional butt electrodes 50, 51 have the problem, wherein disc-shaped air voids 55 remain within a solder 54 between the joint surfaces 50a, 50b, 51a, 51b and the electronic component 52 or the substrate 53.

The air contained in the solder paste is gathered, whereby voids 55 are formed.

It is to be noted that FIGS. 7A, 7B and FIGS. 8A, 8B illustrate only the air voids 55 between the joint surfaces 50b, 51b of one of the butt electrodes 50, 51 and the substrate 53. The air voids 55 also remain within the solder 54 between the joint surfaces 50a, 51a of the other of the butt electrodes 50, 51 and the electronic component 52.

Thus, if the air voids 55 remain between the joint surfaces 50a, 50b, 51a, 51b of the butt electrodes 50, 51 and the electronic component 52 or the substrate 53, an effective joint area between the butt electrodes 50, 51 and the electronic component 52 or the substrate 53 is reduced. In this case, such a problem arises that joint strength between the butt electrodes 50, 51 and the electronic component 52 or the substrate 53 decreases.

Further, areas of the joint surfaces 50b, 51b, with the substrate 53, of the butt electrodes 50, 51 are large, and hence, if the substrate 53 becomes flexural for some reason, a comparatively large bending moment is generated at joint portions between the butt electrodes 50, 51 and the substrate 53.

Thus, if the large bending moment is generated at the joint portions between the butt electrodes 50, 51 and the substrate 53, there might be a possibility in which a crack occurs in the joint portion.

Further, as described above, the joint faces 50a, 50b, 51a, 51b of the butt electrodes 50, 51 are smooth. Therefore, an anchor effect of the solder 54 is difficult to occur with respect to the joint surfaces 50a, 50b, 51a, 51b.

In this case, interfacial peeling occurs between the joint surfaces 50a, 50b, 51a, 51b of the butt electrodes 50, 51 and the solder 54, resulting in such an problem that the joint portion becomes fragile against a impact of dropping.

Moreover, the joint surfaces 50a, 50b, 51a, 51b of the butt electrodes 50, 51 are smooth, and hence there is a problem, wherein the solder 54 is repelled. In this case, the joint strength is lowered.

It is an object of the present invention, which was devised in view of these problems, to provide an electrode, an electronic component and a substrate that are capable of eliminating the air voids generated within the solder between the joint surfaces of the electrode body and the electronic component or the substrate, thereby restraining a decrease in the joint strength between the electrode body and the electronic component or the substrate.

SUMMARY OF THE INVENTION

The present invention has adopted the following device to solve the problems.

The present invention is an electrode so provided as to be soldered to an electronic component and, when the electronic component is mounted on a substrate, soldered to the substrate, comprising a column-like electrode body soldered to the electronic component and to the substrate, and an air discharging device discharging the air in air voids generated within the solder between a joint surface of the electrode body and the electronic component or the substrate when the electrode body is soldered to the electronic component or the substrate.

The electronic component using the column-like electrode can be exemplified by an electronic component to which a large voltage is applied, such as a power source component and a power source module. A shape of this type of electrode can be exemplified such as a cylindrical shape and a square-pole-like shape.

In the present invention, when soldering the electrode body to the electronic component or the substrate, the air discharging device discharges to outside the air in the air voids generated within the solder between the joint surfaces of the electrode body and the electronic component or the substrate. It is therefore possible to restrain the decrease in the joint strength between the electrode and the electronic component or the substrate.

The air discharging device can be exemplified by a groove extending from the vicinity of the center on the joint surface of the electrode body up to an outer peripheral surface of the electrode body.

In the case where the air discharging device is the groove, the air in the air voids generated between the joint surfaces of the electrode body and the electronic component or the substrate, is discharged to outside via the grooves provided in the outer peripheral surface from the grooves provided in the joint surfaces of the electrode body.

The air discharging device can be exemplified by a recessed portion provided substantially at the center on the joint surface of the electrode body and opened in an outer peripheral surface of the electrode body.

If the air voids are formed on the side of the center of the joint surface, the air in the air voids is discharged to outside from the recessed portion.

Further, the present invention is an electronic component so mounted as to be soldered to a substrate, the electrode comprising a column-like electrode body soldered to the electronic component and to the substrate, and an air discharging device discharging the air in air voids generated within the solder between a joint surface of the electrode body and the electronic component or the substrate when the electrode body is soldered to the electronic component or the substrate.

Moreover, the present invention is a substrate mounted with an electronic component including a soldered electrode, the electronic component being mounted by soldering the electrode, the electrode comprising a column-like electrode body, and an air discharging device discharging the air in air voids generated within the solder between a joint surface of the electrode body and the electronic component or the substrate when the electrode body is soldered to the electronic component or the substrate.

According to the present invention, an air extracting device discharges to outside the air in the air voids generated between the joint surfaces of the electrode body and the electronic component or the substrate. Accordingly, it is feasible to restrain the decrease in the joint strength between the electrode body and the electronic component or the substrate.

DETAILED DESCRIPTION OF THE INVENTION

An electrode, an electronic component and a substrate according to the present invention will hereinafter be described in detail with reference to the drawings.

First Embodiment

Figure 1A:
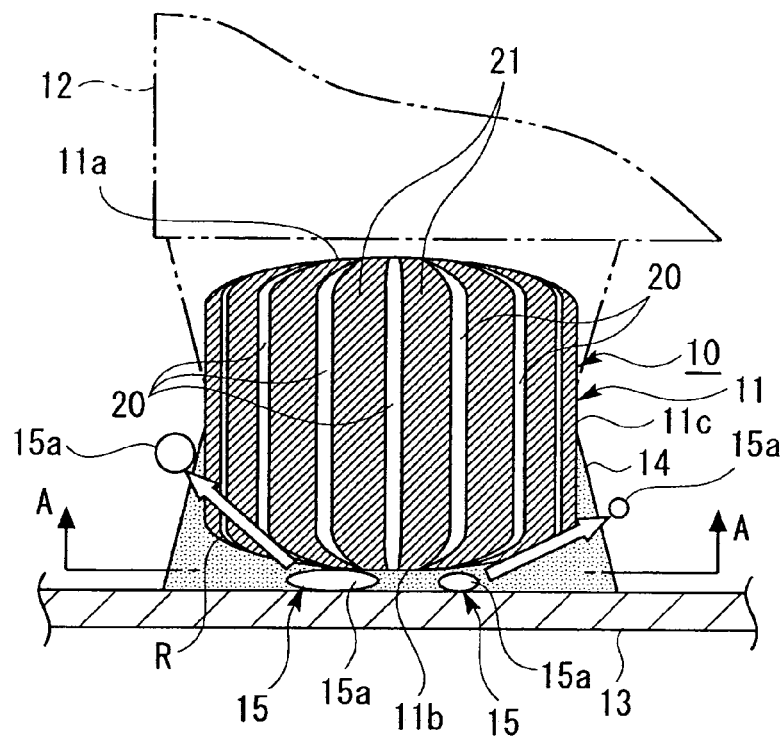
FIG. 1A is a view showing an electrode, an electronic component and a substrate in a first embodiment according to the present invention.
Figure 1B:
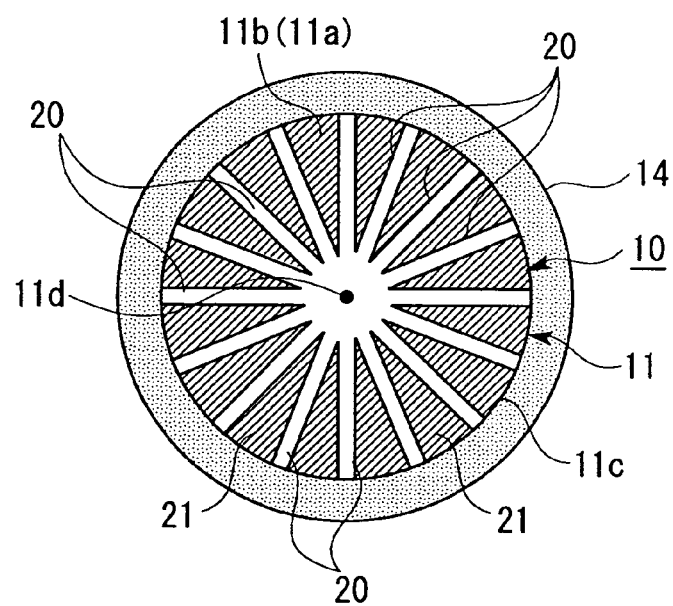
FIG. 1B is a sectional view taken along the line A-A in FIG. 1A.

FIG. 1A is a view showing a butt electrode 10, an electronic component 12 and a substrate 13 in a first embodiment according to the present invention, and FIG. 1B is a view showing a joint surface 11b (11a) of the butt electrode 10 and is also a sectional view taken along the line A-A in FIG. 1A.

The butt electrode 10 is so provided as to be soldered to the electronic component 12 to which a large voltage is applied, such as a power source component and a power source module. Further, when this electronic component 12 is mounted on the substrate 13, the butt electrode 10 is soldered to the substrate 13.

The butt electrode 10 has a cylindrical electrode body 11. This electrode body 11 is provided with grooves 20 serving as an air discharge device for discharging to outside, when the electrode body 11 is soldered to the electronic component 12 or the substrate 13, air 15a within disc-like air voids 15 generated between one joint surface 11a of the electrode body 11 and the electronic component 12 or between the other joint surface 11a of the electrode body 11 and the substrate 13.

The grooves 20 extend, as depicted in FIG. 1B, from the vicinity of a center lid on the joint surfaces 11a and 11b (only the joint surface 11b is illustrated) of the electrode body 11 up to an outer peripheral surface 11c of the electrode body 11. Further, the groove 20 is provided is plural at a predetermined interval.

Figure 2:
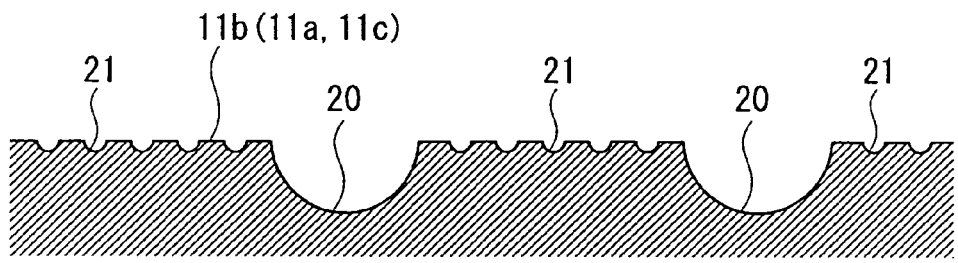
FIG. 2 is a sectional view showing a groove serving as an air discharging device in the first embodiment according to the present invention.

This groove 20 is, as illustrated in FIG. 2, formed in a circularly arched shape in section. This is because if an interior of the groove 20 includes angular portions, the air 15a is easy to stay in the angular portions. It is to be noted that the shape of the groove 20 can be, without being limited to the circularly arched shape, arbitrarily set if not in angular shape.

Further, a size of the groove 20 is set to such a degree that the air 15a within the air void 15 is smoothly discharged outside. If the groove 20 is too small, the air 15a becomes difficult to flow, and hence the groove 20 is set to a proper size.

Figure 4:
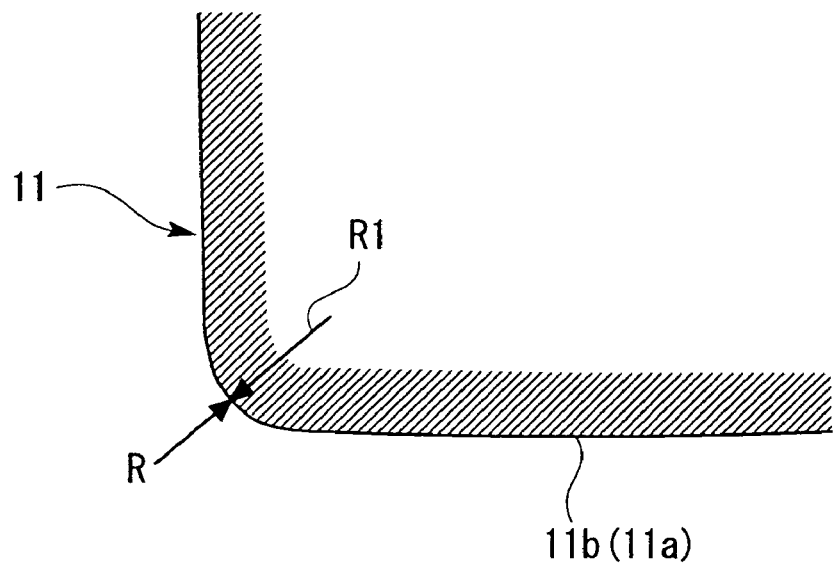
FIG. 4 is a sectional view showing a roundness serving as another air discharging device in the first embodiment according to the present invention.

As shown in FIG. 4, a roundness R serving as the air discharging device is provided at outer peripheral edges of the joint surfaces 11a, 11b of the electrode body 11. This roundness R has a comparatively large radius-of-curvature R1. The roundness R is provided along the entire periphery of each of the joint surfaces 11a, 11b.

Moreover, the electrode body 11 is provided with small grooves 21 serving as an anchor effect generating device that generates an anchor effect in a solder 14. This small groove 21 is provided in plural at a predetermined interval between the grooves 20 and 20.

Note that the anchor effect connotes, as known well, that a bonding agent and the solder permeate rugged portions and gaps in the material surface and thereafter harden. The anchor effect is also called an anchoring effect or a fastener effect. This anchor effect improves a joint effect of the bonding agent and the solder.

A sectional area of this small groove 21 is, as shown in FIG. 2, by far smaller than that of the groove 20. Further, the small groove 21 extends, in the same way as groove 20 does, from the vicinity of the center lid on the joint surfaces 11a and 11b of the electrode body 11 up to the outer peripheral surface 11c of the electrode body 11 (see FIG. 1).

Next, an operation of the butt electrode 10 will be explained. In the butt electrode 10 according to the present invention, as described above, the joint surfaces 11a, 11b of the electrode body 11 and the outer peripheral surface 11c are provided with the plurality of grooves 20 defined as the air discharging device. Further, the roundness R serving as the air discharging device is provided at the outer peripheral edges of the joint surfaces 11a, 11b.

When this butt electrode 10 is soldered to the electronic component 12 or the substrate 13, the butt electrode 10 is disposed on the upside while the electronic component 12 or the substrate 13 is disposed on the downside.

Figure 3:
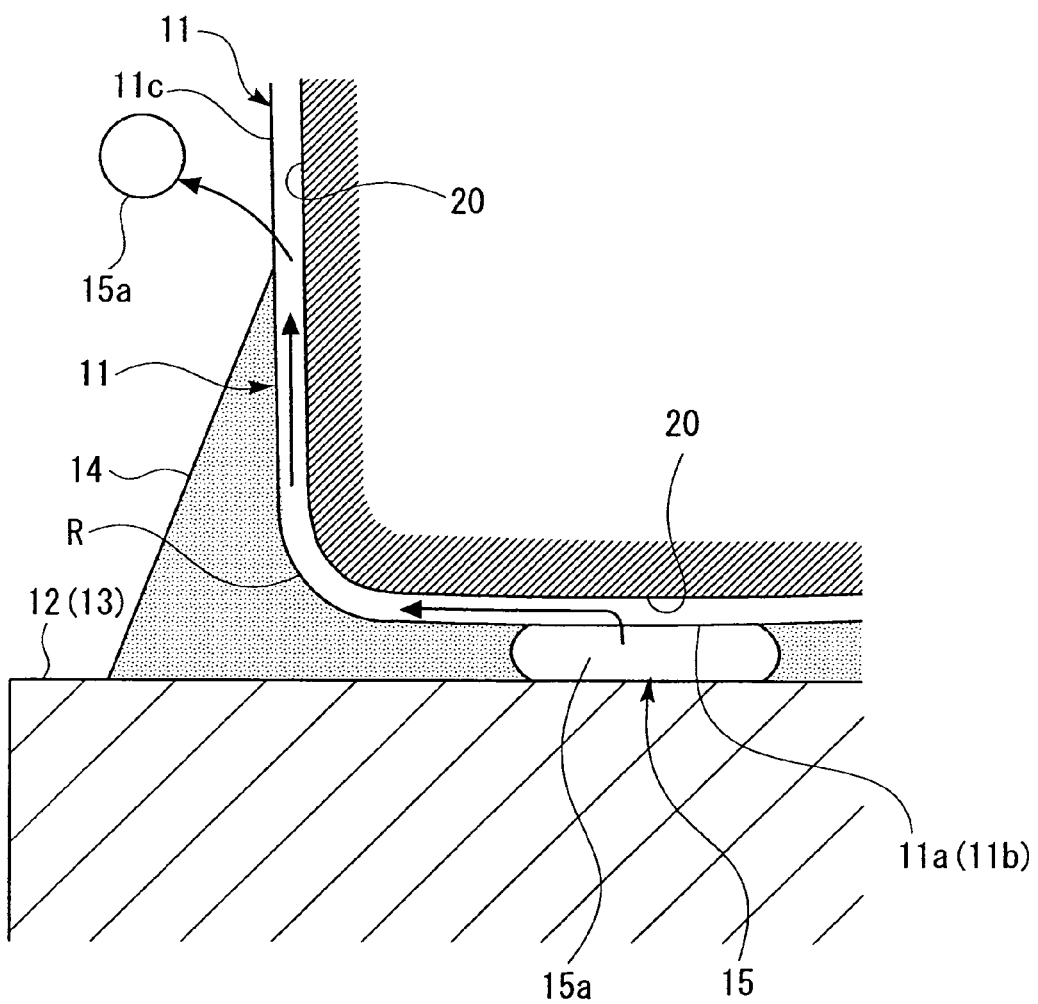
FIG. 3 is a sectional view showing an operation of the air discharging device in the first embodiment according to the present invention.

Further, when this butt electrode 10 is soldered to the electronic component 12 or the substrate 13, as shown in FIG. 3, within the solder 14 between the joint surfaces 11a, 11b of the electrode body 11 and the electronic component 12 or the substrate 13, the air contained in solder pastes is gathered, whereby the air voids 15 might occur.

The air 15a within these air voids 15, before the solder 14 hardens, passes through the plurality of grooves 20 and the roundness R provided in and at the joint surfaces 11a, 11b of the electrode body 11, and flows to the groove 20 provided in the outer peripheral surface 11c. The air 15a is discharged to outside from a portion that is not surrounded by the solder 14 in the groove 20 of the outer peripheral surface 11c. The air voids 15 are thereby eliminated.

In the present invention, the air voids 15 generated within the solder 14 can be eliminated owing to the grooves 20 and the roundness R serving as the air discharging device, and hence an effective joint area between the butt electrode 10 and the electronic component 12 or the substrate 13, can be retained.

It is therefore possible to restrain a decrease in joint strength between the butt electrode 10 and the electronic component 12 or the substrate 13 and a decrease in joint strength between the electronic component 12 and the substrate 13.

Moreover, the comparatively large roundness R is provided at the outer peripheral edges of the joint surfaces 11a, 11b, and hence the stress can be avoided from concentrating on the outer peripheral edges of the joint surfaces 11a, 11b.

With this arrangement, when the substrate 13 becomes flexural, a crack can be restrained from occurring in the joint portion between the butt electrode 10 and the electronic component 12 or the substrate 13.

Figure 5:
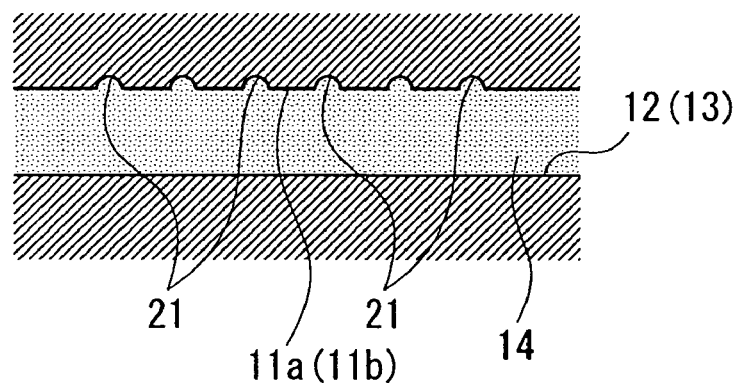
FIG. 5 is an explanatory sectional view showing an operation of an anchor effect in the first embodiment according to the present invention.

Further, in the present invention, as depicted in FIG. 5, the plurality of small grooves 21 serving as the anchor effect generating device are provided in the joint surfaces 11a, 11b and the outer peripheral surface 11c of the electrode body 11. The solder 14 permeates the plurality of small grooves 21, thereby effectively generating the anchor effect.

Accordingly, it is feasible to restrain occurrence of interfacial peeling between the joint surfaces 11a, 11b and the outer peripheral surface 11c of the electrode body 11 and the solder 14. This can further restrain the joint portion between the butt electrode 10 and the electronic component 12 or the substrate 13 from becoming fragile against a dropping impact.

Furthermore, by dint of the anchor effect, the solder 14 can be prevented from being repelled by the joint surfaces 11a, 11b and the outer peripheral surface 11c of the electronic component body 11. It is therefore possible to restrain the decrease in the joint strength between the butt electrode 10 and the electronic component 12 or the substrate 13.

According to the present invention, the solder joint portion of the butt electrode 10 in the power source component and the power source module can be prevented from being broken by the stress generated when inserting, e.g., a motherboard into the housing, vibrations caused during conveyance of a product, the stress generated in an assembly process, an impact caused by the drop and shaking caused by an earthquake.

Further, a tendency at the present is that the power source module is upsized while the electrode is downsized. Then, the electrode is easy to be affected by the stresses and the vibrations described above, however, the present invention can minimize a degree to which the electrode is affected.

Figure 6:
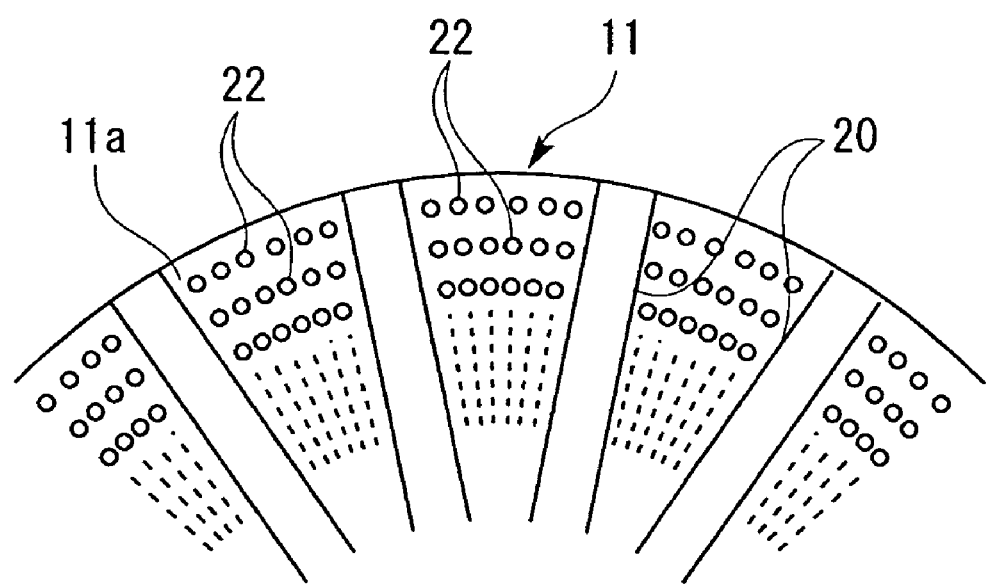
FIG. 6 is a view showing a rugged portion serving as another anchor effect generating device in the first embodiment according to the present invention.

It should be noted that the first embodiment has described the case of providing the small grooves 21 as the anchor effect generating device, however, as illustrated in FIG. 6, a plurality of recessed or protruded portions 21 can be provided as the anchor effect generating device. Further, the anchor effect generating device may also be grid-like grooves.

Second Embodiment

Next, the electrode, the electronic component and the substrate in a second embodiment according to the present invention will be explained. Note that the same components as the electrode 10, the electronic component 12 and the substrate 13 in the first embodiment are marked with the same numerals and symbols, and their detailed descriptions are omitted.

Figure 7A:
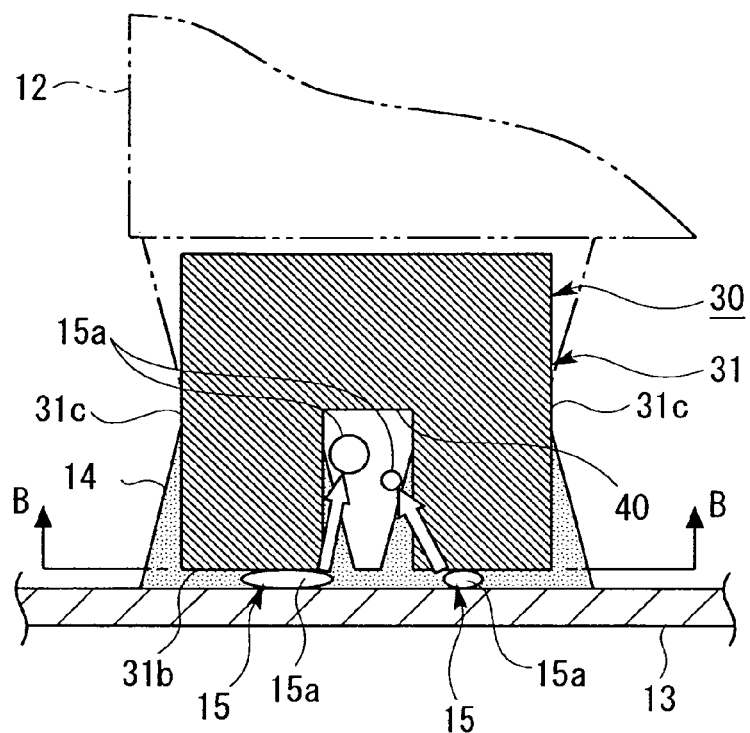
FIG. 7A is a view showing the electrode, the electronic component and the substrate in a second embodiment according to the present invention.
Figure 7B:
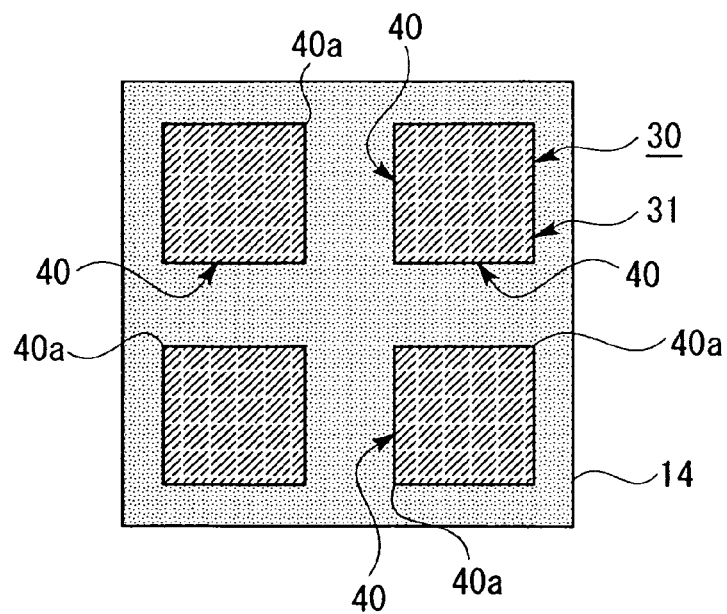
FIG. 7B is a sectional view taken along the line B-B in FIG. 7A.
Figure 8A:
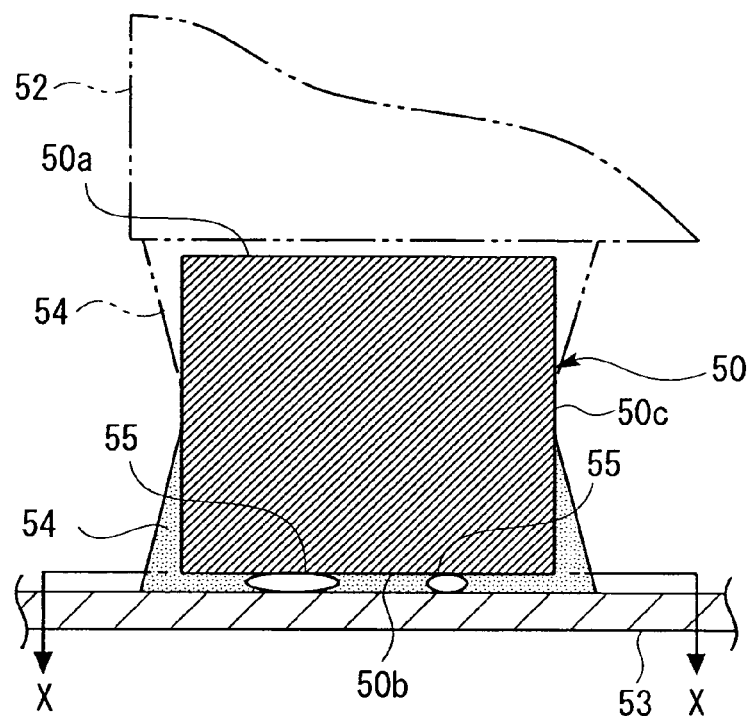
FIG. 8A is a view showing an electrode in the prior art.
Figure 8B:
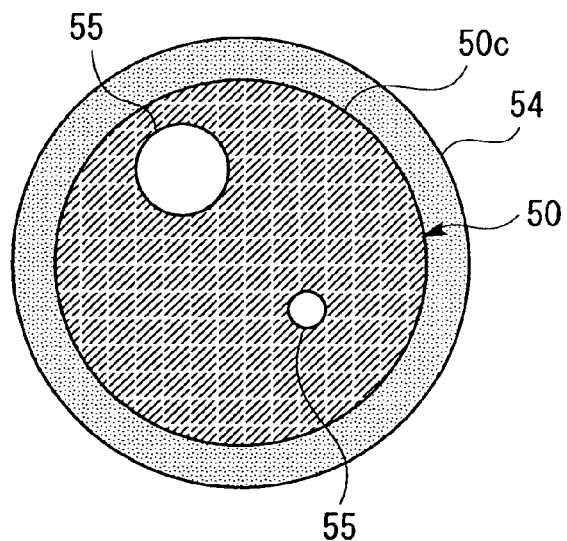
FIG. 8B is a sectional view taken along the line X-X in FIG. 8A.
Figure 9A:
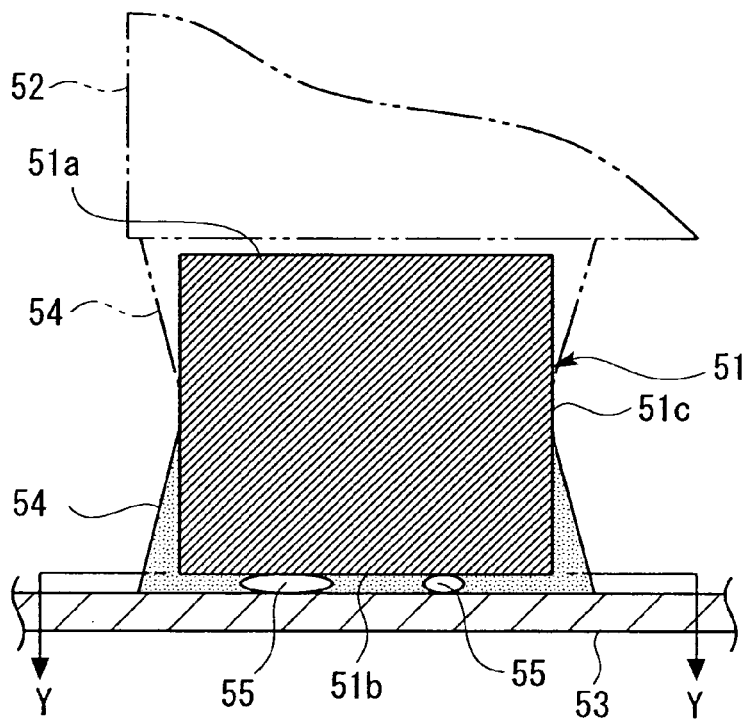
FIG. 9A is a view showing the electrode in another prior art.
Figure 9B:
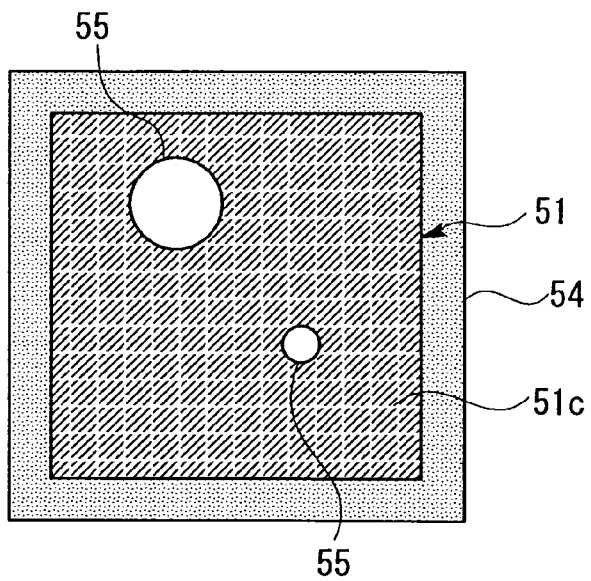
FIG. 9B is a sectional view taken along the line Y-Y in FIG. 9A.

FIG. 7A is a vertical sectional view showing a butt electrode 30, an electronic component 12 and a substrate 13 in the second embodiment according to the present invention, and FIG. 7B is a cross sectional view of the butt electrode 30, taken along the line B-B in FIG. 7A.

This butt electrode 30 has an electrode body 31 taking a square-pole-like shape. A joint surface 31b, facing the substrate 13, of this electrode body 31 is provided with a recessed portion 40 serving as the air discharging device, which is positioned at the center thereof.

This recessed portion 40 has, as depicted in FIG. 5B, a comparatively large capacity. Further, the recessed portion 40 is formed in a cross shape. Then, an opening 40a of the recessed portion 40 is provided substantially at the center of each of four outer peripheral surfaces 31c of the electrode body 31. Part of the opening 40a protrudes towards from the solder 14.

When the electrode body 31 of the butt electrode 30 is soldered to the substrate 13, the air 15a the air voids 15 generated between the joint surface 31b of the electrode body 31 and the substrate 13 escapes to the central portion of the joint surface 31b, in which case this air 15a is discharged to outside via the recessed portion 40. With this arrangement, the air voids 15 are eliminated.

Hence, according to the butt electrode 30, the decrease in the joint strength between the electrode body 31 and the solder 14 can be restrained. Further, it is possible to restrain the decrease in the joint strength between the electronic component 12 employing the butt electrode 30 and the substrate 13. Moreover, the internal surface of the recessed portion 40 is soldered and is thereby strengthened against the flexure and torsion.

Note that a shape, a depth and a width of the recessed portion 40 can be arbitrarily set unless the strength of the electrode body 31 decreases.

<Others>

The disclosure of Japanese patent application No. JP2006-032164 filed on Feb. 9, 2006 including the specification, drawings and abstract are incorporated herein by reference.

What is claimed is:

1. A surface-mount electronic component, comprising:
  a column-like electrode having a bottom surface facing an electronic component; and
  a solder disposed between the bottom surface of the column-like electrode and the electronic component,
  the column-like electrode including a plurality of first grooves radially extending from a center portion of the bottom surface of the column-like electrode to a side surface thereof such that air trapped in the solder is escaped along the plurality of first grooves,
  wherein the column-like electrode further includes a plurality of the second grooves provided between adjacent first grooves, and
  each of the plurality of second grooves has a narrower width than each of the plurality of first grooves.

2. The electronic component according to claim 1, wherein the column-like electrode includes a rounded edge located between the bottom surface and the side surface.

3. The electronic component according to claim 1, wherein the plurality of second grooves obliquely disposed between adjacent first grooves.

4. A substrate unit comprising:
   a substrate;
   an electronic component mounted on a surface of the substrate;
   a column-like electrode disposed between the electronic component and the substrate, the column-like electrode having a bottom surface facing the surface of the substrate; and
   a solder disposed between the bottom surface of the column-like electrode and the surface of the substrate,
   the column-like electrode including a plurality of first grooves radially extending from a center portion of the bottom surface of the column-like electrode to a side surface thereof such that air trapped in the solder is escaped along the plurality of first grooves,
   wherein the column-like electrode further includes a plurality of the second grooves provided between adjacent first grooves, and
   each of the plurality of second grooves has a narrower width than each of the plurality of first grooves.

5. The substrate unit according to claim 4, wherein the column-like electrode includes a rounded edge between the bottom surface and the side surface.

6. The substrate unit according to claim 4, wherein the plurality of second grooves obliquely disposed between adjacent first grooves.

* * * * *